United States Patent
Matsuhira

(10) Patent No.: US 9,829,802 B2
(45) Date of Patent: Nov. 28, 2017

(54) CONVEYING HAND AND LITHOGRAPHY APPARATUS

(71) Applicant: CANON KABUSHIKI KAISHA, Tokyo (JP)

(72) Inventor: Yasunao Matsuhira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 2 days.

(21) Appl. No.: 15/049,445

(22) Filed: Feb. 22, 2016

(65) Prior Publication Data

US 2016/0243707 A1  Aug. 25, 2016

(30) Foreign Application Priority Data

Feb. 25, 2015 (JP) .................................. 2015-034657

(51) Int. Cl.
| | | |
|---|---|---|
| G03B 27/58 | (2006.01) | |
| G03B 27/62 | (2006.01) | |
| G03F 7/20 | (2006.01) | |
| H01L 21/683 | (2006.01) | |
| H01L 21/677 | (2006.01) | |
| B25J 11/00 | (2006.01) | |

(Continued)

(52) U.S. Cl.
CPC ....... G03F 7/70691 (2013.01); B25J 11/0095 (2013.01); B25J 15/0014 (2013.01); B25J 15/0616 (2013.01); G03F 7/7075 (2013.01); H01L 21/67742 (2013.01); H01L 21/6838 (2013.01)

(58) Field of Classification Search
CPC ............. G03F 7/70691; G03F 7/70716; G03F 7/70733; H01L 21/67766

USPC .................... 355/72–76; 414/752.1; 294/189
See application file for complete search history.

(56) References Cited

U.S. PATENT DOCUMENTS

2012/0025054 A1* 2/2012 Musha ...................... F16D 3/48
                                                                 248/371
2015/0008691 A1* 1/2015 Furuichi ........... H01L 21/67742
                                                                 294/189

(Continued)

FOREIGN PATENT DOCUMENTS

| JP | 672974 U | 10/1994 |
|---|---|---|
| JP | 8229866 A | 9/1996 |
| TW | 201106444 A | 2/2011 |

OTHER PUBLICATIONS

Office Action issued in Taiwanese Patent Application No. 105103596, dated Oct. 17, 2016. English translation provided.

*Primary Examiner* — Hung Henry Nguyen
(74) *Attorney, Agent, or Firm* — Rossi, Kimms & McDowell LLP

(57) ABSTRACT

This conveying hand is used for conveying a conveyed object in an adsorbed state with a negative pressure, and comprises a pad having a contact portion that contacts the conveyed object and a concave portion having an internal space that can be evacuated; a base that moves while loading the pad; a first elastic member that movably supports the pad on the base in the direction of gravity of the conveyed object and restricts a movement of the pad on the base in the direction perpendicular to the direction of gravity; and a second elastic member that seals a space communicating with the internal space of the concave portion and movably supports the pad on the base in the direction of gravity.

12 Claims, 3 Drawing Sheets

(51) Int. Cl.
  *B25J 15/00* (2006.01)
  *B25J 15/06* (2006.01)

(56) References Cited

U.S. PATENT DOCUMENTS

2015/0015014 A1* 1/2015 Furuichi .............. B25J 15/0616
  294/189
2015/0246447 A1* 9/2015 Furuichi ........... H01L 21/67766
  294/188

* cited by examiner

CONVEYING HAND AND LITHOGRAPHY APPARATUS

BACKGROUND OF THE INVENTION

Field of the Invention

The present invention relates to a conveying hand that holds a conveyed object, and relates to a lithography apparatus using the same.

Description of the Related Art

Conventionally, a conveying device in which a substrate, for example, a wafer for manufacturing semiconductor devices or a glass plate for manufacturing liquid crystal display devices serving as an conveyed object, has commonly conveyed the conveyed object while adsorbing and holding it by using a conveying hand having an adsorption pad. However, if warpage or distortion has occurred in the conveyed object, the surface of the conveyed object does not fit the adsorption surface of the adsorption pad, and as a result, efficient adsorption is impossible. Japanese Utility Model Registration Laid-Open No. H6-72974 discloses a conveying device in which an elastic member is disposed in the lower portion of the adsorption pad and the adsorption surface is accordingly made to fit the shape of the conveyed object even when warpage or distortion has occurred in the conveyed object. Additionally, Japanese Patent Laid-Open H8-229866 discloses an adsorption pad in which a coil spring is disposed in the lower portion of an adsorption member having an adsorption surface and the adsorption surface is accordingly made to fit the shape of the conveyed object.

However, in the techniques disclosed in the Japanese Utility Model Laid-Open No. H6-72974 and the Japanese Patent Laid-Open No. H8-229866, while the adsorption pad has a structure that flexibly absorbs the shape change of the conveyed object in the direction of gravity, it has a structure that causes a backlash in the plane direction perpendicular to the direction of gravity. Accordingly, there is a probability that the conveyed object shifts from the adsorption surface in the plane direction during the delivery or the conveyance of the object, thereby lowering the positioning accuracy during the conveyance.

SUMMARY OF THE INVENTION

The present invention provides a conveying hand that enables reducing a positional shift of a conveyed object in the direction perpendicular to the direction of gravity.

The present invention is a conveying hand for conveying a conveyed object in an adsorbed state with a negative pressure, and comprises: a pad having a contact portion that contacts the conveyed object and a concave portion having an internal space that can be evacuated; a base that moves while loading the pad; a first elastic member that movably supports the pad on the base in the direction of gravity of the conveyed object and restricts a movement of the pad with respect to the base in the direction perpendicular to the direction of gravity; and a second elastic member that seals a space communicating with the internal space of the concave portion and movably supports the pad on the base in the direction of gravity.

Further features of the present invention will become apparent from the following description of exemplary embodiments (with reference to the attached drawings).

DESCRIPTION OF THE EMBODIMENTS

Hereinafter, a detailed description will be given of preferred embodiments of the present invention with reference to the accompanying drawings.

First Embodiment

First, a description will be given of a conveying hand according to a first embodiment of the present invention. The conveying hand according to the present embodiment is removably disposed in a conveying device in which a substrate, for example, a wafer for manufacturing semiconductor devices or a glass plate for manufacturing liquid crystal display devices, serves as a conveyed object, and is used for conveying the conveyed object in an adsorbed state with a negative pressure. Note that, in each drawing below, the Z-axis is in a direction at which the conveying hand holds (contacts) the conveyed object, that is, the direction of gravity, the X-axis is in a direction in which the conveying hand is attached to the conveying device in the XY-plane that is perpendicular to the Z-axis, and the Y-axis is in a direction perpendicular to the X-axis.

Figure 1:
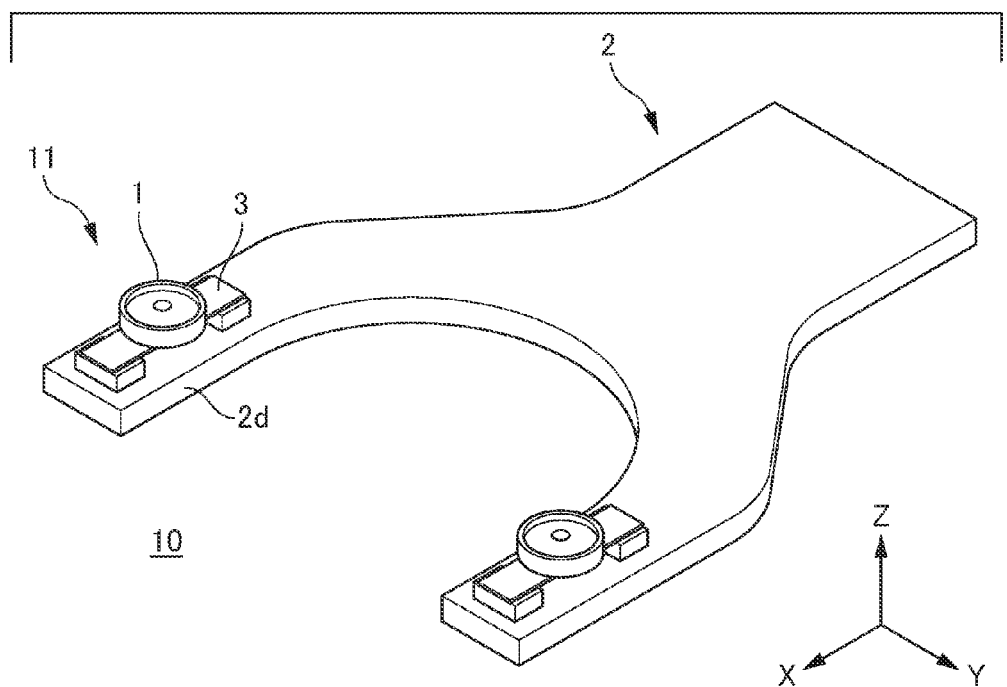
FIG. 1 illustrates a structure of a conveying hand according to a first embodiment of the present invention.

FIG. 1 is a perspective view illustrating a configuration of a conveying hand 10 according to the present embodiment. The conveying hand 10 has a plurality of pad units 11 that includes a pad (adsorption pad) 1 contacting the back surface of the conveyed object (not illustrated) and generates an adsorption force by the negative pressure, and a base 2 that is loaded with the pad unit 11 and serves as a body of the conveying hand 10. Hereinafter, as one example, the disposed number of the pad units 11 in the present embodiment is two. Additionally, the base 2 is entirely made of a plate-shaped member and includes a plurality of finger portions 2d (in the present embodiment, two positions) that extends in a predetermined direction. The pad unit 11 is provided at a position at which the conveyed object can be held on the finger portion 2d (on the finger portion) in a well-balanced manner in terms of its weight.

Figure 2:
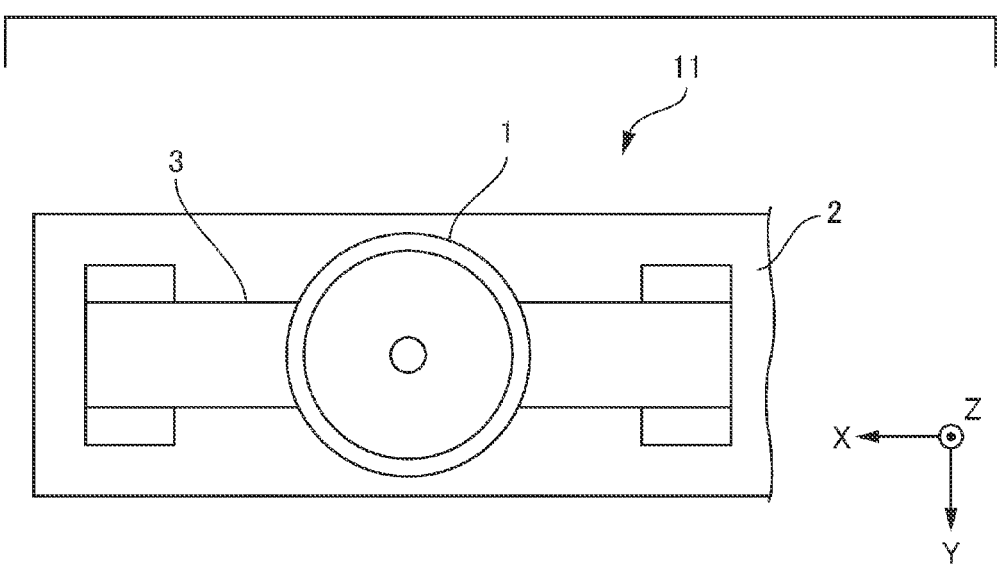
FIG. 2 is a plan view illustrating a structure of a pad unit in the first embodiment.
Figure 3:
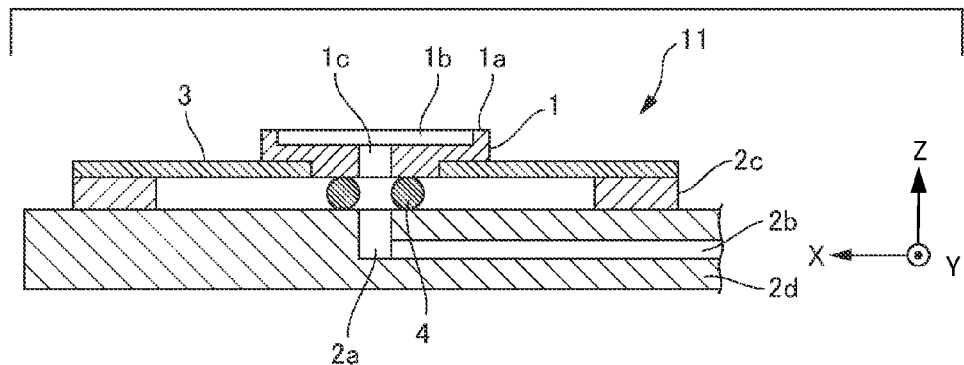
FIG. 3 is a cross-sectional view illustrating a configuration of the pad unit in the first embodiment.

FIG. 2 is a plan view of the pad unit 11, and FIG. 3 is a cross-sectional view of the pad unit 11. The pad unit 11 includes a pad 1, plate springs 3, and an O-ring 4. The pad 1 has an adsorption surface (adsorption region) that enables adsorbing and holding the conveyed object by vacuum adsorption. Specifically, the pad 1 has a contact portion 1a that contacts the conveyed object and a concave portion 1b having an internal space that can be evacuated in a state in which the contact portion 1a is in contact with the conveyed object. Additionally, one end of the pad 1 communicates with the concave portion 1b and the other end thereof has a through-hole 1c that opens towards the base 2. Here, the base 2 has a vacuum exhaust hole 2a of which one end opens toward the pad 1, and a flow path 2b of which one end communicates with the vacuum exhaust hole 2a and the other end opens so as to be consecutively connected with a vacuum exhaust means (not illustrated). In particular, the vacuum exhaust hole 2a is desirably formed so as to be substantially concentric to the through-hole 1c of the pad 1 when the pad 1 is disposed on the base 2.

The plate springs 3 are first elastic members that are displaceable in the direction of gravity, which is the thickness direction of the plate, support the pad 1 in the XY plane direction perpendicular to the direction of gravity with respect to the base 2, and regulate the displacement of the pad 1 in the XY plane direction. That is, rigidity of the first elastic member of the plate springs 3 in the direction of gravity is lower than that in the direction perpendicular to the direction of gravity. Accordingly, the plate springs 3 supports the pad 1 so as to have flexibility that follows a tilt due to the warpage and distortion of the conveyed object due to the weight of the conveyed object in the Z tilt direction and so as to have rigidity of the first elastic member that allows regulating the position of the pad 1 in the XY plane direction even while conveying the object. Additionally, the plate springs 3 have a shape serving the extending direction on the one finger portion 2d (the X-axis direction in coordinates of each drawing) as the longitudinal direction and serving the direction orthogonal to the extending direction as the short direction, and are provided one by one at the positive side and negative side in the extending direction on the basis of the position of the one pad 1. Subsequently, one end of each of the plate springs 3 is, for example, connected to the lower surface of the pad 1 (rear surface that is on the side opposite to the adsorption surface) and the other end thereof is connected to the upper surface of the support base 2c formed so as to have a fixed height on the base 2. Additionally, an adhesive may be used for the connection method, or any other fixing method may be used. For example, if the plate springs 3 are made of a SUS (stainless steel) material having the thickness of 0.05 mm, the width of 10 mm, and the length of 30 mm, the order of the spring constant is $10^6$ N/m in the XY plane direction, $10^2$ N/m in the Z-axis direction, and $10^1$ N/m in the Z-tilt direction, the above condition will be satisfied.

The O-ring 4 is a second elastic member that has a hollow-shape, is positioned to contact both the pad 1 and the base 2 between them, seals a space communicating with the internal space of the concave portion 1b, and movably supports the pad 1 to the base 2 in the direction of gravity. One opening of the O-ring 4 fits the through-hole 1c of the pad 1 and the other opening fits the vacuum exhaust hole 2a of the base 2, and thereby a flow path communicating spatially is formed. Additionally, for example, while the O-ring 4 is connected to the base 2 by an adhesive or the like, it can contact the pad 1 or separate from it. Note that, although the O-ring 4 is in contact only with the pad 1 in the example shown in FIG. 3, it may contact a portion that is movable in the direction of gravity, which includes the plate springs 3 if air tightness is maintained at the contact surface of the plate springs 3.

Figure 4:
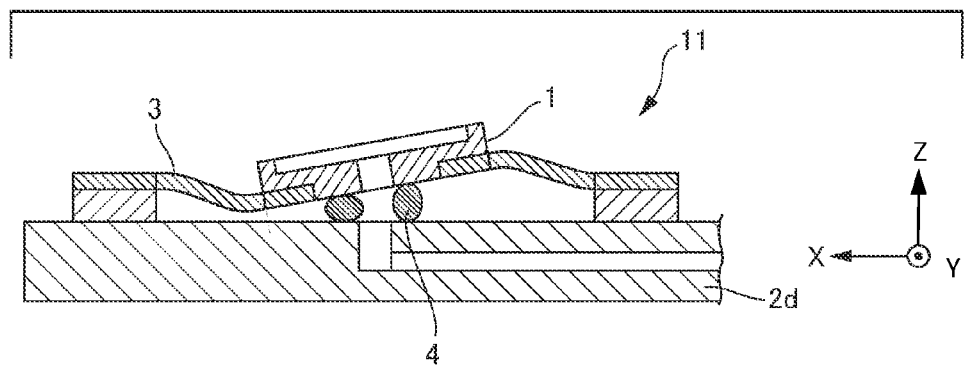
FIG. 4 illustrates a deformed state of the pad unit in the first embodiment.

As an example, FIG. 4 is a cross-sectional view for explaining a state of the pad unit 11 that is adsorbing and holding the conveyed object in which the warpage or the like has occurred on the adsorption surface. In this case, the plate springs 3 are bent or twisted in the Z-tilt direction after receiving the weight of the conveyed object, and the pad 1 connected to the plate springs 3 tilts by following the warpage or the like of the conveyed object. Here, as described above, the rigidity of the first elastic member of the plate springs 3 in the XY plane direction is higher than that in the Z-tilt direction. Accordingly, the pad unit 11 can always suppress a movement in the XY plane direction (positional shift) as much as possible against the warpage of the conveyed object, and as a result, the conveying hand 10 is allowed to maintain a high positioning accuracy. At this time, the O-ring 4 collapses due to its elasticity, and a vacuum passage between the through-hole 1c and the vacuum exhaust hole 2a (air tightness with the outside world) is maintained.

Additionally, in general, when a plurality of pad units is attached to the base, differences in the height and plane parallelism of the adsorption surface of the pad sometimes occur because of the tolerance of the member component or assembly error thereof. In contrast, in the present embodiment, the pads 1 are respectively tilted by the plate springs 3, and the O-rings 4 respectively collapse, and as a result, the difference as described above can be absorbed.

Additionally, in general, the delivery of the conveyed object to a particular object with the conveying hand is performed in a state in which vacuum adsorption is canceled in order to suppress damage to the conveyed object (for example, a scratch caused by suddenly peeling of the conveyed object from the pad). At this time, because the conveyed object is not held by the conveying hand, the positioning accuracy of the conveyed object may decrease due to the vibration of the peripheral units and the like. In the present embodiment, the O-ring 4 is capable of contacting the pad 1 and separating from it. Therefore, when the conveying hand 10 performs the delivery operation of the conveyed object in a vacuum adsorption state, the O-ring 4 is separated from the pad 1 before the pad 1 is separated from the conveyed object, and a space between the O-ring 4 and the pad 1 is exposed to the air first. Accordingly, it is possible to suppress the damage to the conveyed object even when the conveying hand 10 performs the delivery operation of the conveyed object in a vacuum adsorption state. Accordingly, it is possible to suppress the positional shift of the conveyed object due to, for example, the vibrations of the peripheral units caused by canceling the vacuum adsorption even when the conveying hand 10 performs the delivery operation of the conveyed object in a vacuum adsorption state. Note that the pad 1 and the O-ring 4 may be configured so that the contact area with the O-ring 4 of the pad 1 becomes smaller than that with the conveyed object of the pad 1 by using another method in place of the adhesion of the O-ring 4 to the base 2, or using both of them.

Furthermore, in general, there are cases in which a pattern for manufacturing the semiconductor devices formed in the conveyed object is damaged by ESD (electrostatic discharge) when the conveyed object is charged, and therefore the conveying hand also needs to be configured of a material having an appropriate conductivity. Accordingly, in the present embodiment, a ceramic having conductivity is used for the material for the pad 1, the SUS system is used for the material of the plate springs 3, and the conduction from the conveyed object to the base 2 is then secured to also allow inhibiting the charge of the conveyed object. For example, the conductivity of the material configuring the pad 1 and the plate springs 3 is desirably $1.0 \times 10^3$ [Ω/cm] or more and $1.0 \times 10^8$ [Ω/cm] or less, and more preferably, it is desirably $1.0 \times 10^6$ [Ω/cm] or more, and $1.0 \times 10^7$ [Ω/cm] or less. In contrast, in a case where the plate springs 3 are configured of a conductive material such as the SUS material, ESD can be inhibited by providing an insulating processing layer on the surface of the conductive material.

As described above, according to the present embodiment, it is possible to provide a conveying hand that is capable of reducing the positional shift of the conveyed object in the direction perpendicular to the direction of gravity.

Second Embodiment

Figure 5:
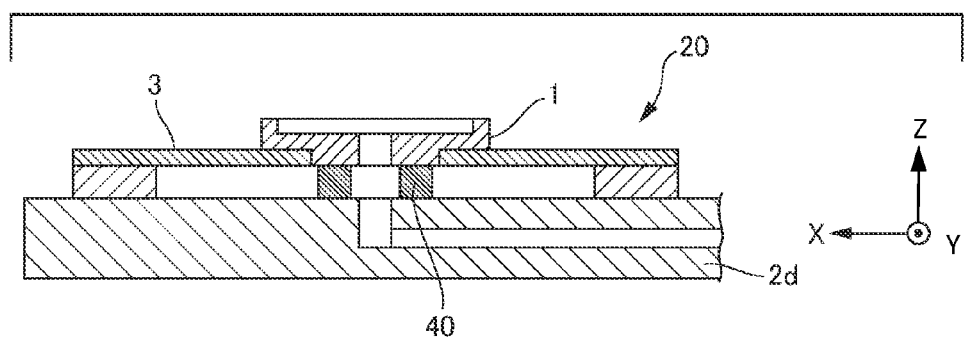
FIG. 5 is a cross-sectional view illustrating a configuration of the pad unit in a second embodiment.

Next, a description will be given of a conveying hand according to a second embodiment of the present invention. FIG. 5 is a cross-sectional view illustrating a configuration of a pad unit 20 in the present embodiment. In the first embodiment described above, the O-ring 4 is employed as the second elastic member. However, this is an example of the elastic member, and in this embodiment, the pad unit 20 has a feature, as the second elastic member, in which a substantially cylindrical elastic member 40 that has also a hollow-shape is employed in place of the O-ring 4 of the first embodiment. The operation of the elastic member 40 is similar to that of the O-ring 4. Here, the elastic member 40 can respond to larger warpage of the surface of the conveyed object by employing a softer elastic member than the O-ring, for example, an independent foamed sponge.

Conveying Device

Figure 6:
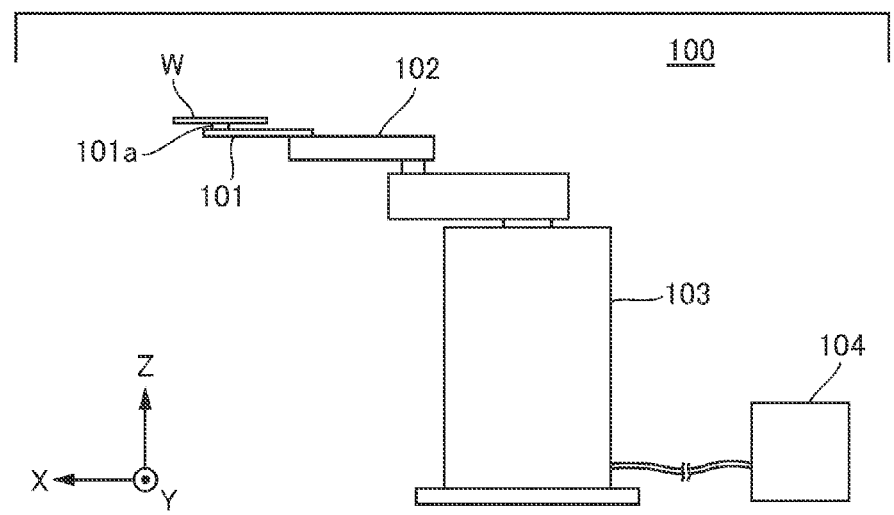
FIG. 6 illustrates a configuration of a conveying device according to one embodiment of the present invention.

Next, a description will be given of a conveying device according to one embodiment of the present invention. The conveying device according to the present embodiment is used for, for example, an apparatus for manufacturing semiconductor devices or an apparatus for manufacturing liquid crystal display devices, and conveys a substrate, which is a conveyed object (wafer or glass plate), to and from the substrate stage and the like. FIG. 6 is a schematic diagram illustrating a configuration of a conveying device 100 according to the present embodiment. The conveying device 100 has a conveying hand 101 that holds a conveyed object W, an arm unit 102 that can move the conveying hand 101 while supporting it, and a drive unit 103 that drives the arm unit 102. Additionally, the conveying device 100 is provided so as to connect to a pad unit 101a of the conveying hand 101, and is connected to a vacuum exhaust means 104 that controls the adsorption (vacuum exhaust) of the conveyed object W by vacuum adsorption through a pipe. The conveying device 100 employs the conveying hand according to the above embodiments as the conveying hand 101 in particular. According to such a conveying device 100, it is possible to convey the conveyed object W while reducing the positional shift of the conveyed object W in the direction perpendicular to the direction of gravity.

Lithography Apparatus

Next, a description will be given of a lithography apparatus according to an embodiment of the present invention. The lithography apparatus according to the present embodiment is used in, for example, the lithography process in the manufacture process of semiconductor devices, liquid crystal display devices, or the like. Hereinafter, as an example, the lithography apparatus according to the present embodiment is an exposure apparatus used in the lithography process in the manufacture process of semiconductor devices.

Figure 7:
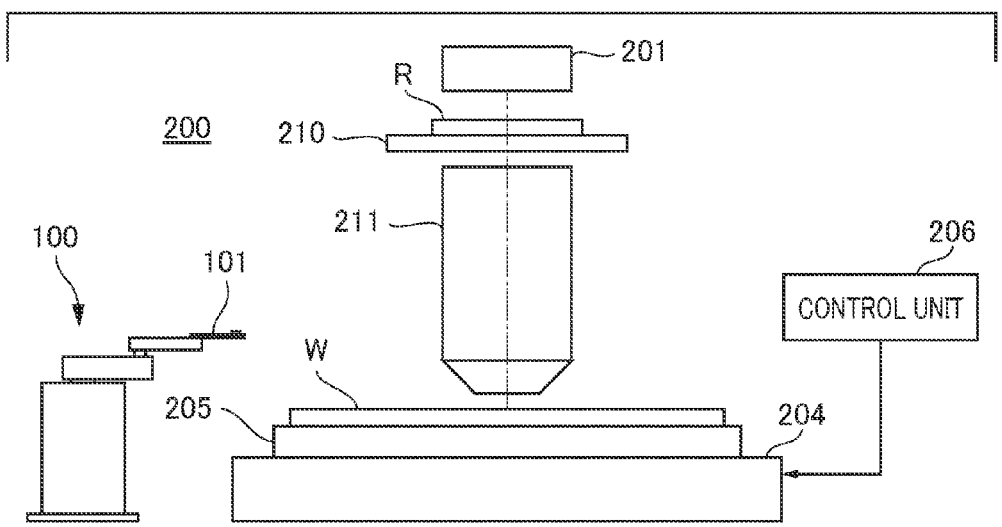
FIG. 7 illustrates a configuration of an exposure apparatus according to one embodiment of the present invention.

FIG. 7 is a schematic view illustrating a configuration of an exposure apparatus 200 according to the present embodiment. The exposure apparatus 200 is, for example, a projection exposure apparatus that exposes (processes) a pattern image formed on a reticle R on a wafer W (on the substrate) by a step-and-repeat method. The exposure apparatus 200 includes an illumination system 201, a reticle stage 210, a projection optical system 211, a wafer stage 204, and the conveying device 100 as described above, and a control unit 206 as a processing unit. The illumination system 201 adjusts light emitted from a light source (not illustrated) and illuminates the reticle R. The reticle R is, for example, an original made of a silica glass, at which a pattern to be transferred onto the wafer W (for example, a circuit pattern) is formed. The reticle stage 210 is movable in each of the X-axis and the Y-axis directions while holding the reticle R. The projection optical system 211 projects the light passed through the reticle R onto the wafer W at a predetermined magnification (for example, ½). The wafer W is a substrate, for example, made of monocrystalline silicon with a resist (photosensitive agent) applied to its surface. The wafer stage 204 holds the wafer W through a chuck 205 and is movable in at least each of the X-axis and the Y-axis directions. The control unit 206 is configured of, for example, a computer, is connected to each component of the exposure apparatus 200 via lines, and can integrate the operation of each component in accordance with a program and the like. The exposure apparatus 200 then employs the above conveying device 100. According to the exposure apparatus 200 as described above, the positional shift of the wafer W in the direction perpendicular to the direction of gravity during the transfer of the wafer W is reduced, and therefore may be advantageous in, for example, improving the yield.

Note that, in the above description, the example of the exposure apparatus is described as a lithography apparatus, the present invention is not limited thereby. For example, a drawing apparatus that performs drawing (processing) on the substrate (photosensitive agent on the substrate) with charged particle beams such as electron beams, or an imprint apparatus that molds an imprint material on the substrate by using a mold and performs forming (processing) of the pattern on the substrate may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-034657 filed Feb. 25, 2015, which is hereby incorporated by reference herein in its entirety.

What is claimed is:

1. A conveying hand for adsorbing a conveyed object, the conveying hand comprising:
    a base;
    a pad configured to contact the conveyed object and provide a first space between the pad and the conveyed object;
    a first elastic member fixed to the base and configured to movably support the pad; and
    a second elastic member disposed between the base and the pad and provide a second space communicating with the first space,
    wherein the pad contacts the second elastic member to permit evacuation of the first space and the second space, and cause the conveyed object to be adsorbed to the pad, and
    wherein the pad, which is supported by the first elastic member, moves to separate from the second elastic member to release the conveyed object from being adsorbed to the pad.

2. The conveying hand according to claim 1, wherein the first elastic member is configured to movably support the pad on the base in a direction of gravity and restricts a substantial movement of the pad with respect to the base in a direction perpendicular to the direction of gravity.

3. The conveying hand according to claim 1, wherein:
the first elastic member is a plate spring, and
a direction of gravity serves as a thickness direction of the plate spring.

4. The conveying hand according to claim 3, wherein:
the base includes a plurality of finger portions that extend in a predetermined direction,
each finger portion includes the pad, the first elastic member, and the second elastic member, and
the plate spring has a shape in which an extending direction of the plurality of finger portions serves as a longitudinal direction, and a direction orthogonal to a direction serves as a short direction.

5. The conveying hand according to claim 1, wherein the second elastic member is an O-ring.

6. The conveying hand according to claim 1, wherein a conductivity of the material configuring the pad and the first elastic member is $1.0 \times 10^3$ [Ω/cm] or more and $1.0 \times 10^8$ [Ω/cm] or less.

7. The conveying hand according to claim 6, wherein the conductivity of the material configuring the pad and the first elastic member is $1.0 \times 10^6$ [Ω/cm] or more and $1.0 \times 10^7$ [Ω/cm] or less.

8. The conveying hand according to claim 1, wherein the first elastic member has a portion of a conductive material, and an insulating processing layer provided on a surface of the portion.

9. The conveying hand according to claim 1, wherein a contact area of the pad with respect to the second elastic member is smaller than that with respect to the conveyed object of the pad.

10. The conveying hand according to claim 1, wherein rigidity of the first elastic member in a direction of gravity is lower than rigidity of the first elastic member in the direction perpendicular to the direction of gravity.

11. A lithography apparatus comprising:
a conveying hand for adsorbing a conveyed object; and
a processing unit for processing a substrate that has been conveyed by the conveying hand,
wherein the conveying hand comprises:
a base;
a pad configured to contact the conveyed object and provide a first space between the pad and the conveyed object;
a first elastic member fixed to the base and configured to movably support the pad; and
a second elastic member disposed between the base and the pad and provide a second space communicating with the first space,
wherein the pad contacts the second elastic member to permit evacuation of the first space and the second space, and cause the conveyed object to be adsorbed to the pad, and
wherein the pad, which is supported by the first elastic member, moves to separate from the second elastic member to release the conveyed object from being adsorbed to the pad.

12. The conveying hand according to claim 1, wherein the second elastic member is configured to movably support the pad on the base in a direction of gravity.

* * * * *